(12) United States Patent
Huang et al.

(10) Patent No.: US 8,901,644 B2
(45) Date of Patent: Dec. 2, 2014

(54) FIELD EFFECT TRANSISTOR WITH A VERTICAL CHANNEL AND FABRICATION METHOD THEREOF

(75) Inventors: Ru Huang, Beijing (CN); Yujie Ai, Beijing (CN); Zhihua Hao, Beijing (CN); Shuangshuang Pu, Beijing (CN); Jiewen Fan, Beijing (CN); Shuai Sun, Beijing (CN); Runsheng Wang, Beijing (CN); Xiaoyan Xu, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 13/821,944

(22) PCT Filed: Sep. 9, 2011

(86) PCT No.: PCT/CN2011/079521
§ 371 (c)(1),
(2), (4) Date: Mar. 8, 2013

(87) PCT Pub. No.: WO2012/045257
PCT Pub. Date: Apr. 12, 2012

(65) Prior Publication Data
US 2013/0168759 A1   Jul. 4, 2013

(30) Foreign Application Priority Data
Oct. 9, 2010   (CN) .......................... 2010 1 0506129

(51) Int. Cl.
*H01L 29/78* (2006.01)
(Continued)

(52) U.S. Cl.
CPC ........... *H01L 29/7827* (2013.01); *H01L 29/775* (2013.01); *H01L 29/0676* (2013.01);
(Continued)

(58) Field of Classification Search
CPC ............. H01L 29/7827; H01L 29/7802; H01I 29/78642
USPC ......... 438/138, 137, 156, 192, 260, 209, 212, 438/268, 173; 257/329, E27.065
See application file for complete search history.

(56) References Cited

U.S. PATENT DOCUMENTS 5,014,098 A * 5/1991 Schlais et al. ............ 257/316
5,225,701 A * 7/1993 Shimizu et al. ........... 257/347
(Continued)

FOREIGN PATENT DOCUMENTS

CN         1399349 A    2/2003
CN       101939842 A    8/2010
(Continued)

OTHER PUBLICATIONS

Franssila, Sami, Introducation to Microfabrication, 1st ed., H, Wiley, 2004, pp. 134-135.*
(Continued)

*Primary Examiner* — Tom Thomas
*Assistant Examiner* — John Bodnar
(74) *Attorney, Agent, or Firm* — Maier & Maier, PLLC

(57) ABSTRACT

Disclosed herein is a field effect transistor with a vertical channel and a fabrication method thereof. A channel region of the field effect transistor is a circular ring-shaped Si platform, which is formed over a substrate and perpendicular to the substrate; a source, which is made of polysilicon, is located at an upper end of the Si platform; a drain is disposed at an outside of a lower end of the circular ring-shaped Si platform; a gate is placed on an outer side surface of the circular ring-shaped Si platform; and an inside of the circular ring-shaped Si platform is filled with a dielectric material. In comparison with the conventional vertical structure MOSFET with a Si platform, the circular ring-shaped structure field effect transistor according to the invention can effectively suppress the short channel effect and improve the device performance.

7 Claims, 3 Drawing Sheets

(51) Int. Cl.
- *H01L 29/66* (2006.01)
- *H01L 29/08* (2006.01)
- *H01L 29/04* (2006.01)
- *H01L 29/775* (2006.01)
- *H01L 29/06* (2006.01)
- *H01L 21/28* (2006.01)
- *H01L 29/41* (2006.01)
- *H01L 29/423* (2006.01)

(52) U.S. Cl.
CPC ...... *H01L 29/66666* (2013.01); *H01L 29/0847* (2013.01); *H01L 21/2815* (2013.01); *H01L 29/0657* (2013.01); *H01L 29/413* (2013.01); *H01L 29/0653* (2013.01); *H01L 29/0692* (2013.01); *H01L 29/42376* (2013.01); *H01L 29/66439* (2013.01); *H01L 29/04* (2013.01)
USPC .................. 257/329; 257/E27.065; 438/156; 438/192; 438/268; 438/296

(56) References Cited

U.S. PATENT DOCUMENTS

| | | | | |
|---|---|---|---|---|
| 5,312,767 | A * | 5/1994 | Shimizu et al. | 438/268 |
| 5,413,948 | A * | 5/1995 | Pfiester et al. | 438/152 |
| 6,632,712 | B1 * | 10/2003 | Ang et al. | 438/212 |
| 8,294,205 | B2 | 10/2012 | Fujimoto | |
| 2001/0021545 | A1 * | 9/2001 | Houlihan et al. | 438/199 |
| 2002/0001884 | A1 | 1/2002 | Manning | |
| 2004/0222496 | A1 * | 11/2004 | Freeman et al. | 257/569 |
| 2005/0121706 | A1 | 6/2005 | Chen et al. | |
| 2005/0285183 | A1 * | 12/2005 | Baik | 257/316 |
| 2007/0052012 | A1 | 3/2007 | Forbes | |
| 2009/0032849 | A1 | 2/2009 | Higashino | |

FOREIGN PATENT DOCUMENTS

| | | |
|---|---|---|
| CN | 102074577 A | 5/2011 |
| EP | 2242108 A1 | 10/2010 |
| JP | 2010135592 A | 6/2010 |

OTHER PUBLICATIONS

S. Wolf and R.N. Tauber, Silicon Processing for the ULSI Era. vol. 1, 2nd ed., Lattice Press 2000, p. 201.*

International Search Report dated Nov. 24, 2011, as issued in corresponding International Patent Application No. PCT/CN2011/079521, filed Sep. 9, 2011 (with English Translation)—6 pgs.

* cited by examiner

FIELD EFFECT TRANSISTOR WITH A VERTICAL CHANNEL AND FABRICATION METHOD THEREOF

RELATED APPLICATIONS

This is the US, national stage application which claims priority under 35 U.S.C. §371 to International Patent Application No. PCT/CN2011/079521 filed on Sep. 9, 2011, which claims priority to Chinese Patent Application No. 201010506129.1 filed on Oct. 9, 2010, the disclosures of Which are incorporated by reference herein their entireties.

FIELD OF THE INVENTION

The present invention refers to a semiconductor device, more particularly, to a field effect transistor with a vertical channel structure and a fabrication method thereof.

BACKGROUND OF THE INVENTION

A field effect transistor with a vertical channel is a new solution for obtaining a small-sized field effect transistor (MOSFET). A channel length of the field effect transistor with a vertical channel is not defined directly by a photolithography process, but by an etching process for silicon platform, an ion implantation process or an epitaxy process. Therefore, a short-channel device can be easily fabricated without the complicated photolithography process. Further, the fabrication process is completely compatible with technologies for a planar MOSFET. A device with a vertical channel is considered by academia and industry to be one of the most promising novel devices for replacing the planar MOSFET. Now, they have been applied into areas such as ROM and DRAM.

According to the fabrication process, the field effect transistor with a vertical may be divided into two types. As for one type, the vertical channel is formed by an etching process for silicon platform and an ion implantation process. In the other type, the vertical channel is formed by an epitaxy process. An advantage of the former is that the process is relatively simple, yet a disadvantage of which is that the length of the channel is difficult to be controlled precisely. By contrast, the length of the channel can be controlled through the epitaxy process in the latter, however, the disadvantage lie in the complexity of the process and the strictness of equipments and process conditions. A MOSFET with a vertical structure in which a source is formed of polysilicon is disclosed in a Chinese patent No. 02129384.8. According to this patent, an area of an active region can be effectively reduced and the channel length can be controlled in a better way. Further, this device can be compatible with bipolar devices, which laid a foundation for obtaining a BiCMOS. As an increase of the integrated degree and a shrink of the device size, a short channel effect in a conventional silicon platform structure is getting more obvious, which has a serious impact on device performance. Thus, it is necessary to propose a device structure, which is capable of suppressing the short channel effect of a device with a vertical silicon platform, and a fabrication method thereof.

SUMMARY OF THE INVENTION

A purpose of the invention is to provide a field effect transistor with a vertical channel, which is capable of suppressing a short channel effect more effectively and improving device performance.

According to the present invention, a field effect transistor with a vertical channel is wherein a channel region of the transistor is a circular ring-shaped Si platform, which is formed over a substrate and perpendicular to the substrate; a source, which is made of polysilicon, is located at an upper end of the circular ring-shaped Si platform; a drain is disposed outside a lower end of the circular ring-shaped Si platform; a gate is placed on an outer side surface of the circular ring-shaped Si platform; and an inside of the circular ring-shaped Si platform is filled with a dielectric material.

Essential structural features of the field effect transistor with a vertical channel according to the invention are that, the channel region of the transistor is a nano-sized circular ring, with the dielectric material filled inside the ring. The circular ring-shaped Si platform has a height of 50 nm to 500 nm, an inner diameter of 20 nm to 500 nm, and an outer diameter of 30 nm to 600 nm. The dielectric material filled inside the circular ring-shaped Si platform is one or more selected from silicon oxide, silicon nitride, hafnium oxide, zirconium oxide and titanium oxide.

Before fabricating the above-mentioned field effect transistor with a vertical structure, a layout design is performed first (as shown in FIG. 1), wherein: an active region is defined; in the active region a region for a Si circular ring is defined, where a circular ring-shaped Si platform is to be formed through an etching process and a vertical channel is to be formed on the outer side surface of the circular ring-shaped Si platform; a source and a drain of the transistor have an asymmetric structure, where a source lead-out is located in a field region while a drain lead-out is disposed inside the active region; a polysilicon gate lead-out is located in the field region; and lead holes are opened in the source, the drain and the gate region, and metal leads are designed.

Next, the fabrication method includes steps as followings:

1) Performing a device isolation process on a substrate to define an active region, wherein:

the device isolation may be achieved by means of isolation technology of conventional local oxidation in field region, so that the active region is defined;

2) Performing an implantation process on the active region to adjust a threshold, wherein:

an n-type implantation or a p-type implantation is performed to the active region according to a desired type of the transistor to be fabricated;

3) Depositing a source polysilicon layer and depositing a masking layer on the source polysilicon layer, wherein:

in general, the source polysilicon layer is deposited to a thickness of 100 nm to 300 nm by using a low pressure chemical vapor deposition (LPCVD), and then a silicon oxide layer is deposited to 30 nm to 50 nm as a masking layer;

4) Performing an etching process to form a circular ring-shaped Si platform, wherein:

firstly a photoresist is coated on the masking layer so that the masking layer is etched by using the photoresist as a mask through an anisotropic dry etching process; next, the source polysilicon layer and the Si substrate are sequentially etched, so as to form the circular ring-shaped Si platform; and after the etching process the photoresist and the masking layer are removed; the Si platform has a height that is determined by the channel length, an inner diameter of 20 nm to 500 nm, and an outer diameter of 30 nm to 600 nm;

5) Filling a dielectric material inside the circular ring-shaped Si platform, wherein:

the dielectric material is deposited in the active region, and the dielectric material inside the circular ring is protected through a photolithography while the dielectric material outside the circular ring is eroded;

6) Forming a lightly doped region (LDD region), wherein:

Firstly a sacrifice oxide layer is grown and then an ion implantation process is performed so that the LDD region of the drain is formed on the surface of the substrate; and the sacrifice layer is removed;

7) Growing a gate oxide layer, wherein:

The gate oxide layer with a thickness of 3 nm to 10 nm may be formed on the source polysilicon layer, the Si platform and the surface of the Si substrate, by using a dry-oxygen oxidation process;

8) Depositing a gate polysilicon layer, and performing a heavily doping process to the gate polysilicon layer; performing an annealing process to active impurities; and then etching the gate polysilicon layer to form a polysilicon sidewall on an outer side surface of the circular ring-shaped Si platform, wherein:

the gate polysilicon layer is depositing on the gate oxide layer by using a low pressure chemical vapor deposition process; a common method for doping is ion implantation process or performing an in-situ doping process while growing the polysilicon layer; and then the polysilicon layer is etched to form the polysilicon sidewall, i.e. the gate, by using an anisotropic dry etching process;

9) Performing an ion implantation to the source and the drain; and

10) Depositing a low-oxygen layer and performing an annealing process for densification; performing an etching process for forming lead holes; and then sputtering metals and alloying to form lead-outs of the source, the drain and the gate.

According to the invention, the most essential structural features of the field effect transistor with a Si nano-ring vertical structure lie in that, the channel region of the transistor is a nano-sized circular ring, with the dielectric material filled inside the ring. In comparison with the conventional MOSFET with a Si platform vertical structure, such field effect transistor with a circular ring structure can effectively suppress the short channel effect and improve the device performance.

In these figures, 201 denotes a Si substrate; 202 denotes a first silicon oxide masking layer; 203 denotes a silicon nitride layer; 204 denotes a field oxide layer; 205 denotes a source polysilicon layer; 206 denotes a second silicon oxide masking layer; 207 denotes a Si nano ring; 208 denotes a dielectric material; 209 denotes an LDD region; 210 denotes a gate dielectric layer; 211 denotes a gate polysilicon layer; and 212 denotes a drain region.

DETAILED DESCRIPTION OF THE EMBODIMENTS

Hereinafter, the invention will be further described in detail by an embodiment of fabricating an N-type MOSFET with a Si nano-ring vertical channel.

Figure 1:
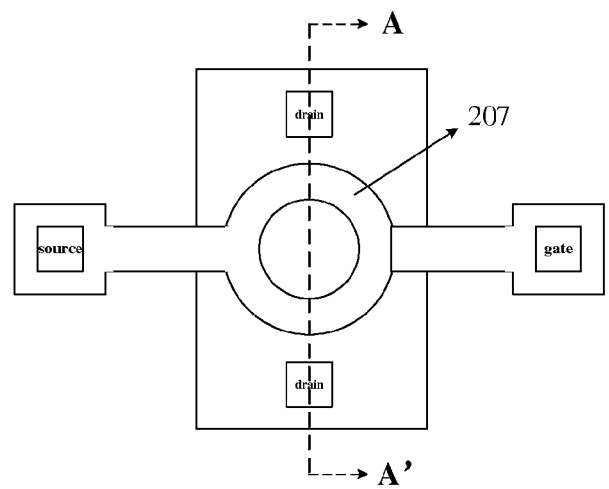
FIG. 1 is a schematic view showing a layout (top view) of a MOSFET with a Si nano-ring vertical channel of the present invention.

FIG. 1 is a layout of the field effect transistor according to the embodiment of the invention, wherein: an area for a Si circular ring, which is to be etched to form a circular ring silicon platform, is defined in an active region, and a vertical channel will be formed on an outer side surface of the circular ring-shaped Si platform. The source and the drain of the transistor are asymmetric. The source lead-out is located in the field region, whereas the drain lead-out is disposed in the active region. The lead-out for the gate polysilicon layer is located in the field region. Lead holes are opened in the source, the drain and the gate regions, and metal leads are designed.

Figure 2A:
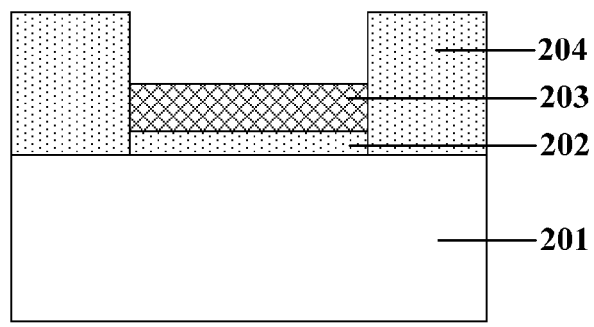
FIGS. 2(a) to 2(h) are schematic views showing process steps for fabricating an N-type MOSFET with a vertical structure according to an embodiment of the invention. Each of FIGS. 2(a) to 2(h) is a cross-sectional view taken along a line A-A' of FIG. 1.

A fabrication process of the transistor is described as follows:

1) A Si substrate 201 is isolated by using an LOCOS isolation process, so as to define an active region of the transistor, as shown in FIG. 2(a).

Detailed processes of this step include steps as follows. First, silicon oxide and silicon nitride, i.e. a first silicon oxide masking layer 202 and a silicon nitride layer 203, are sequentially grown on the Si substrate 201, wherein the silicon oxide layer is grown by a thermal oxidation process to a thickness of 30 nm, whereas the silicon nitride layer is grown by a low pressure chemical vapor deposition (LPCVD) process to a thickness of 100 nm. Next, the silicon nitride layer that corresponds to an area that is not covered by a photoresist over the substrate (corresponding to a field region to be formed subsequently) is removed by performing a photolithography process and an etching process. Subsequently, an ion implantation process is performed to prevent the field region from being open, wherein the implanted ion is B, with a dose on a level of $1\times10^{13}$ cm-2 and an energy of 40-80 keV. The unprotected silicon oxide is removed by a wet erosion process. A field oxide layer 204 is grown by using a thermal oxidation process. A growth temperature for growing the field oxide layer 204 according the embodiment is 850-1000° C., and a growth thickness is 450-800 nm.

Figure 2B:
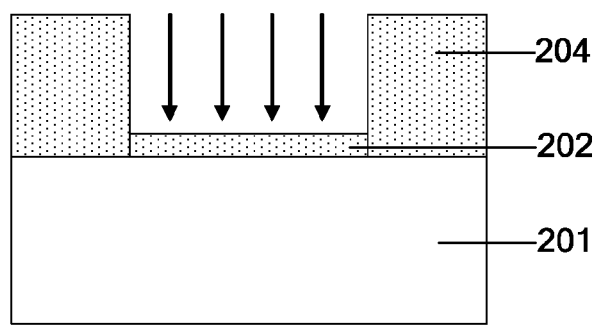

2) An ion implantation is performed to adjust a threshold, as shown in FIG. 2(b)

Detailed processes of this step include steps as follows. The silicon nitride layer in the active region is removed by a wet erosion process and an ion implantation is performed so as to adjust a threshold voltage of the transistor. According to the embodiment, the implanted ion is B, with a dose range of $1\times10^{13}$ cm-2 to $1\times10^{14}$ cm-2 and an implantation energy range of 80 to 100 keV. After the implantation process, the first silicon oxide masking layer 202 is removed by using a wet erosion process.

Figure 2C:
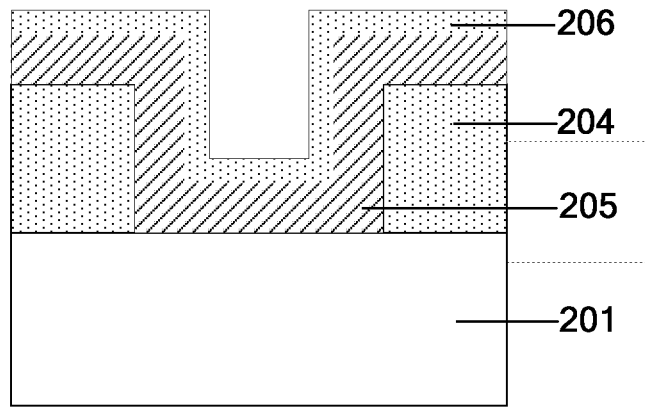

3) A polysilicon layer for the source is deposited, as shown in FIG. 2(c).

Detailed processes of this step include steps as follows. A polysilicon layer 205 with a thickness of 100 to 300 nm is deposited in the active region by using an LPCVD process. The polysilicon layer 206 is to be used as a source of the transistor. Next, a second silicon oxide masking layer 206 is deposited to a thickness of 30-50 nm.

Figure 2D:
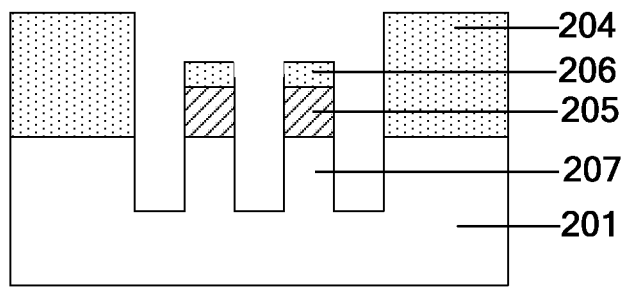

4) An etching process is performed to form a Si platform, as shown in FIG. 2(d).

Detailed processes of this step include steps as follows. First of all, a conventional photolithography process is performed, and then the second silicon oxide masking layer 206 that is not covered by the photoresist used as a mask is removed through an anisotropic dry etching process. Next, the polysilicon layer 205 and the Si substrate 201 are sequentially etched by using an anisotropic dry etching, so as to form a circular ring-shaped Si platform 207. A thickness of the circular ring is 10-200 nm. A depth for etching the Si substrate, that is, a height of the circular ring-shaped Si platform is determined by a desired channel length of the MOSFET.

After performing the etching process, the photoresist and the second silicon oxide masking layer 206 is removed.

Figure 2E:
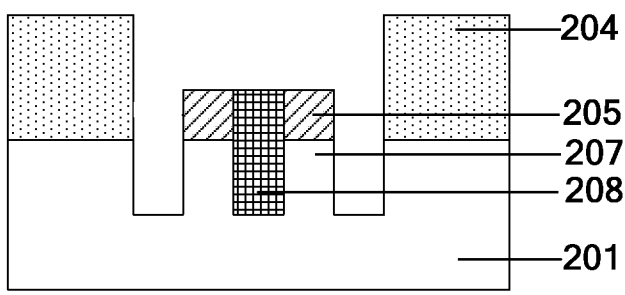

5) A dielectric material is filled within the circular ring, as shown in FIG. 2(e).

Detailed processes of this step include steps as follows. A dielectric material to fill the circular ring is deposited in the active region. The dielectric material within the circular ring is protected by a photoresist through a photolithography process, while the dielectric material outside the circular ring is eroded. And then, the photoresist is removed.

Figure 2F:
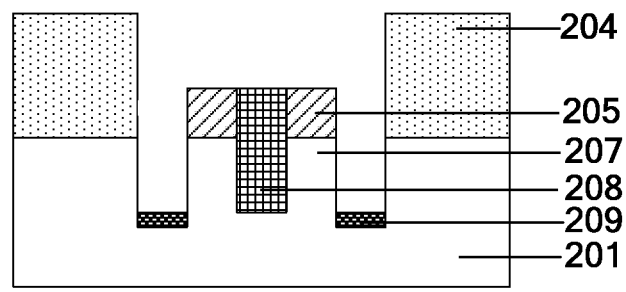

6) An LDD region of the transistor is formed, as shown in FIG. 2(f).

Detailed processes of this step include steps as follows. Firstly, a sacrifice oxide layer is grown with a thickness of about 30 nm, so as to reduce defects on the sidewall of the circular ring-shaped Si platform while serving as a masking layer for the subsequent ion implantation process. After the oxidation process, an As ion implantation process is performed to the Si substrate 201, with a dose of $1\times10^{13}$ cm$^{-2}$ to $1\times10^{14}$ cm$^{-2}$ and an implantation energy of 30 keV to 60 keV, so that an LDD region 209 is formed. Subsequently, the sacrifice oxide layer is removed by using a wet erosion process.

7) A gate oxide layer is grown.

A gate oxide layer, i.e. a gate dielectric layer 210 with a thickness of 3-10 nm is formed by using a dry-oxygen oxidation process.

Figure 2G:
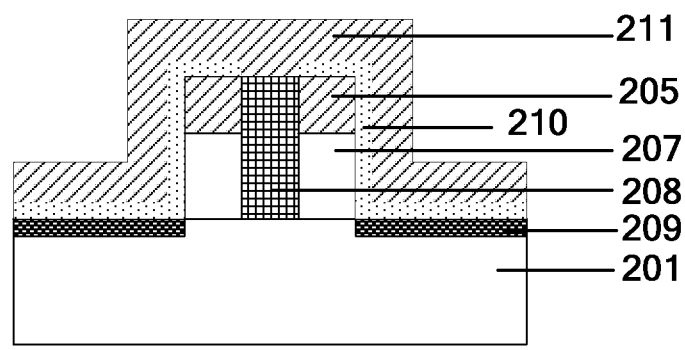

8) A polysilicon layer is deposited and a heavily doping process is performed to the polysilicon, and then an annealing process is performed to active impurities, as shown in FIG. 2(g).

Detailed processes of this step include steps as follows. A gate polysilicon layer 211 with a thickness of 250 nm is deposited on the gate dielectric layer 210 by using an LPCVD process. After that the gate polysilicon 211 is doped, wherein a common doping method is an ion implantation process or an in-situ doping performed while growing the polysilicon layer. According to the embodiment, an ion implantation process is used, wherein P is implanted with a dose of $1\times10^{15}$ cm$^{-2}$ to $1\times10^{16}$ cm$^{-2}$ and an implantation energy of 80 keV to 120 keV. After the implantation process, an annealing process is performed at a temperature of 900 to 1100° C.

Figure 2H:
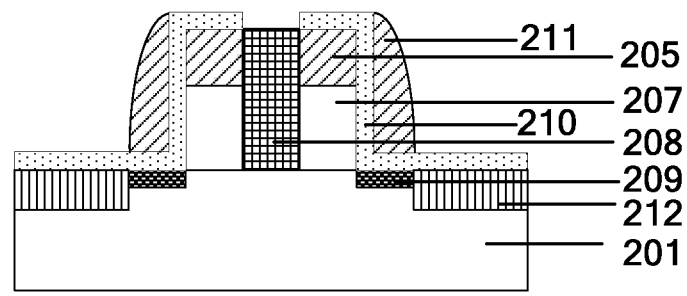

9) The gate polysilicon layer 211 is etched, and an implantation process is performed for the source and the drain, as shown in FIG. 2(h).

The gate polysilicon layer 211 is etched by using an anisotropic dry etching process, so as to form a polysilicon sidewall on the outer side surface of the circular ring-shaped Si nano ring. As is implanted into the source and the drain with a dose of $1\times10^{15}$ cm$^{-2}$ to $1\times10^{16}$ cm$^{-2}$, and an implantation energy of 80 keV to 100 keV.

10) A low-oxygen layer is deposited. And, an annealing process for densification, an etching process for forming lead-out holes, sputtering metal and alloying are performed so that the lead-outs for the source, the drain and the gate are formed.

While embodiments of the invention have been described in detail above, it will be understood to those skilled in the art that modifications and changes can be made to the present invention without departing from the spirit and the scope of the invention. Therefore, the device according to the invention is not limited to the structure described in the embodiments, and the fabrication method thereof is not limited to the disclosure of the embodiments ether. Rather, the scope of the invention should only be defined in light of the appended claims.

What is claimed is:

1. A method of fabricating a field effect transistor with a vertical channel comprising:
    performing an isolation process on a Si substrate to define an active region;
    performing an implantation process to the active region to adjust a threshold;
    depositing a source polysilicon layer, which is to be formed as a source, on a surface of the Si substrate in the active region, and depositing a masking layer on the source polysilicon layer;
    performing an etching process so that a stack of the masking layer, the source polysilicon layer and the Si substrate are sequentially etched and then removing the masking layer to form a circular ring-shaped Si platform with the source polysilicon layer on top, and subsequently filling a dielectric material inside the circular ring-shaped Si platform;
    forming an LDD region for a drain on the surface of the Si substrate outside the circular ring-shaped Si platform;
    growing a gate oxide layer on surfaces of the source polysilicon layer, the Si platform and the Si substrate;
    depositing a gate polysilicon layer on the gate oxide layer to form a gate, and performing a heavily doping process to the gate polysilicon layer; performing an annealing process to active impurities; and then etching the gate polysilicon layer to form a polysilicon sidewall on an outer side surface of the circular ring-shaped Si platform;
    performing an ion implantation to the source and the drain;
    depositing a low-oxygen layer and performing an annealing process densification; performing an etching process for forming lead-out holes, sputtering metals, and alloying to form lead-outs of the source, the drain and the gate.

2. The fabrication method according to claim 1, wherein the isolation process is achieved by a technology of local oxidation in field region.

3. The fabrication method according to claim 1, wherein performing the etching process further comprises coating a photoresist on the masking layer so that the masking layer is etched through an anisotropic dry etching process by using the photoresist as a mask; sequentially etching the source polysilicon layer and the Si substrate, so as to form the circular ring-shaped Si platform; and removing the photoresist and the masking layer after the etching process.

4. The fabrication method according to claim 1, wherein filling the dielectric material further comprises depositing the dielectric material in the active region; and removing the dielectric material outside the Si platform by erosion while the dielectric material inside the circular ring-shaped Si platform is protected through a photolithography process.

5. The fabrication method according to claim 1, wherein filling the dielectric material further comprises that the filled dielectric material is selected from one or more of silicon oxide, silicon nitride, hafnium oxide, zirconium oxide and titanium oxide.

6. The fabrication method according to claim 1, wherein forming the LDD region further comprises growing a sacrifice oxide layer and performing an ion implantation process; forming the LDD region for the drain on the surface of the substrate; and removing the sacrifice oxide layer.

7. The fabrication method according to claim 1, wherein depositing the gate polysilicon layer, further comprises growing the gate polysilicon layer on the gate oxide layer by using a low pressure chemical vapor deposition process; performing at least one of ion implantation process for doping to the gate polysilicon layer, an in-situ doping process while growing the gate polysilicon layer; and subsequently etching the gate polysilicon layer to form the polysilicon sidewall by using an anisotropic dry etching process.

* * * * *